US009698110B2

(12) United States Patent
Ishida

(10) Patent No.: US 9,698,110 B2
(45) Date of Patent: Jul. 4, 2017

(54) SEMICONDUCTOR DEVICE WITH INTEGRATED ANTENNA

(71) Applicant: Renesas Electronics Corporation, Kawasaki-shi, Kanagawa (JP)

(72) Inventor: Motoi Ishida, Kanagawa (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 14/296,067

(22) Filed: Jun. 4, 2014

(65) Prior Publication Data

US 2014/0374888 A1    Dec. 25, 2014

(30) Foreign Application Priority Data

Jun. 20, 2013    (JP) .................................. 2013-129464

(51) Int. Cl.
*H01L 23/66*    (2006.01)
*H01L 23/495*    (2006.01)
(Continued)

(52) U.S. Cl.
CPC ............ *H01L 23/66* (2013.01); *H01L 23/495* (2013.01); *H01L 23/49541* (2013.01);
(Continued)

(58) Field of Classification Search
CPC . H01L 23/66; H01L 23/495; H01L 23/49838; H01L 2224/48091; H01L 2224/73265; H01L 2224/49171; H01L 24/48; H01L 24/32; H01L 24/45; H01L 2924/12041; H01L 2924/16195; H01L 23/498; H01L 2224/45144; H01L 2224/484; H01L 2221/68377; H01L 2223/6611; H01L 2223/6627; H01L 2223/6677; H01L 2223/6688; H01L 21/56;
(Continued)

(56) References Cited

U.S. PATENT DOCUMENTS 7,425,756 B2 *   9/2008   Danno et al. ................. 257/672
8,188,582 B2 *   5/2012   Seo ................... H01L 23/49503
                                                                257/666

(Continued)

FOREIGN PATENT DOCUMENTS

JP    2005038232 A  *  2/2005
JP    2005182330 A  *  7/2005
(Continued)

OTHER PUBLICATIONS

Machine translation of the foreign Reference JP 2005-038232, pp. 1-16.*

*Primary Examiner* — Natalia Gondarenko
(74) *Attorney, Agent, or Firm* — Sughrue Mion, PLLC

(57) ABSTRACT

A high frequency signal can be transmitted and received in a semiconductor device. In a QFP, an antenna (frame body) is supported by three suspension leads. The antenna is arranged to be symmetrical with respect to a first virtual diagonal line of a plan view of a sealing body. One of the three suspension leads is arranged on the first virtual diagonal line. With this configuration, discontinuities of a wave of a signal in the antenna can be reduced, as a result of which the high frequency signal of 5 Gbps class can be transmitted and received in the QFP.

19 Claims, 10 Drawing Sheets

(51) Int. Cl.
*H01L 23/498* (2006.01)
*H01L 23/31* (2006.01)
*H01L 23/00* (2006.01)

(52) U.S. Cl.
CPC .......... *H01L 24/49* (2013.01); *H01L 23/3107* (2013.01); *H01L 24/06* (2013.01); *H01L 24/29* (2013.01); *H01L 24/32* (2013.01); *H01L 24/45* (2013.01); *H01L 24/48* (2013.01); *H01L 24/73* (2013.01); *H01L 24/83* (2013.01); *H01L 24/85* (2013.01); *H01L 2223/6611* (2013.01); *H01L 2223/6677* (2013.01); *H01L 2224/04042* (2013.01); *H01L 2224/05553* (2013.01); *H01L 2224/06135* (2013.01); *H01L 2224/2919* (2013.01); *H01L 2224/32245* (2013.01); *H01L 2224/45144* (2013.01); *H01L 2224/45147* (2013.01); *H01L 2224/48091* (2013.01); *H01L 2224/48247* (2013.01); *H01L 2224/48647* (2013.01); *H01L 2224/48847* (2013.01); *H01L 2224/49177* (2013.01); *H01L 2224/73265* (2013.01); *H01L 2224/83447* (2013.01); *H01L 2224/85447* (2013.01); *H01L 2924/181* (2013.01)

(58) Field of Classification Search
CPC ......... H01L 23/49541; H01L 23/49575; H01L 23/3107; H01L 24/06; H01L 24/29; H01L 24/49; H01L 24/73; H01L 24/83; H01L 24/85; H01L 2924/00; H01L 2924/181; H01L 2224/32245; H01L 2224/48247; H01L 2224/48257; H01L 2224/05553; H01L 2224/48137; H01L 2224/48647; H01L 2224/48847; H01L 2224/49177; H01L 2224/45147; H01L 2224/04042; H01L 2224/06135; H01L 2224/2919; H01L 2224/85447; H01L 2224/83447
USPC ............... 257/664, 676, 666, 693, 694, 695, 257/E23.037, E23.043; 455/252.1, 333, 455/334, 73
See application file for complete search history.

(56) References Cited

U.S. PATENT DOCUMENTS

| | | | |
|---|---|---|---|
| 2001/0054980 A1* | 12/2001 | Nakamura | H01Q 9/045 343/700 MS |
| 2006/0033664 A1* | 2/2006 | Soler Castany et al. | 343/700 MS |
| 2008/0073758 A1* | 3/2008 | James | 257/666 |

FOREIGN PATENT DOCUMENTS

| | | |
|---|---|---|
| JP | 2005-301635 A | 10/2005 |
| JP | 2006-221211 A | 8/2006 |

* cited by examiner

SEMICONDUCTOR DEVICE WITH INTEGRATED ANTENNA

CROSS-REFERENCE TO RELATED APPLICATIONS

The disclosure of Japanese Patent Application No. 2013-129464 filed on Jun. 20, 2013 including the specification, drawings and abstract is incorporated herein by reference in its entirety.

BACKGROUND

The present invention relates to a semiconductor device, and more particularly to a technique effectively applied to a semiconductor device having an antenna therein.

Japanese Unexamined Patent Application Publication No. 2005-301635 discloses a structure having a semiconductor chip, a mounting portion on which the semiconductor chip is placed, and an antenna. Japanese Unexamined Patent Application Publication No. 2005-301635 also discloses a structure in which the antenna is configured by two or more coils that are arranged to overlap with each other vertically.

Also, Japanese Unexamined Patent Application Publication No. 2006-221211 discloses a structure in which a wireless IC tag formation region is disposed on a semiconductor chip where a semiconductor integrated circuit is formed, a wireless IC tag is formed on the same chip, and a conductive pattern serving as an antenna is formed on the semiconductor chip, or in a package where the semiconductor chip is implemented.

SUMMARY

A technique has been known in which, with the use of an electromagnetic coupling between antennas arranged in the vicinity of each other, data transmission between semiconductor chips connected to the respective antennas is conducted as a non-contact and high-speed baseband transmission. In this communication system, high-speed transmission is enabled, and low power consumption is also effective because no modulation circuit is required.

There is a technique in which the antenna is formed within a semiconductor package in applying the above communication system to the semiconductor device. However, it is difficult to increase a size (increase an inductance) of the antenna while suppressing an influence of an electromagnetic field on the semiconductor chip by the antenna.

That is, the antenna size must be increased for the purpose of ensuring a communication distance, but the influence of the electromagnetic field on the semiconductor chip becomes also larger as the antenna size is larger.

Therefore, it is desirable to establish the technique of the semiconductor device including the antenna, which can conduct a communication without degrading the performance of the semiconductor chip.

If the data transmission has a communication speed of about 1 Gbps, the semiconductor device can be realized as a package structure even if the antenna is supported at about five portions.

However, when the data transmission has the communication speed of 5 Gbps class, if the antenna is supported at five portions, because a frequency of the signal is high (high frequency signal), noise increases due to the generation of reflected waves at the support portions (discontinuities of a wave of the signal), thereby making it difficult to transmit and receive a high frequency signal of 5 Gps class.

None of Japanese Unexamined Patent Application Publication Nos. 2005-301635 and 2006-221211 discloses an antenna (support) structure that takes a treatment of the high frequency signal of 5 Gbps class into consideration.

The other problems and novel features will become apparent from the description of the present specification and the attached drawings.

According to one aspect of the present invention, a semiconductor device includes a die pad, a semiconductor chip, a plurality of terminal portions, a frame body having plurality of bends arranged between a first end and a second end, three suspension leads that support the frame body, a first conductive member that connects any electrode pad of the semiconductor chip to the first end of the frame body, and a second conductive member that connects any electrode pad of the semiconductor chip to the second end of the frame body. Further, the semiconductor device includes a plurality of third conductive members that connects the electrode pads of the semiconductor chip to the plurality of terminal portions, and a sealing body that seals the semiconductor chip. The frame body is arranged to be symmetrical with respect to a virtual diagonal line of a plan view of the sealing body, and any one of the three suspension leads is arranged on the virtual diagonal line.

According to the aspect of the invention, the high frequency signal can be transmitted and received in the semiconductor device.

DETAILED DESCRIPTION

Figure 1:
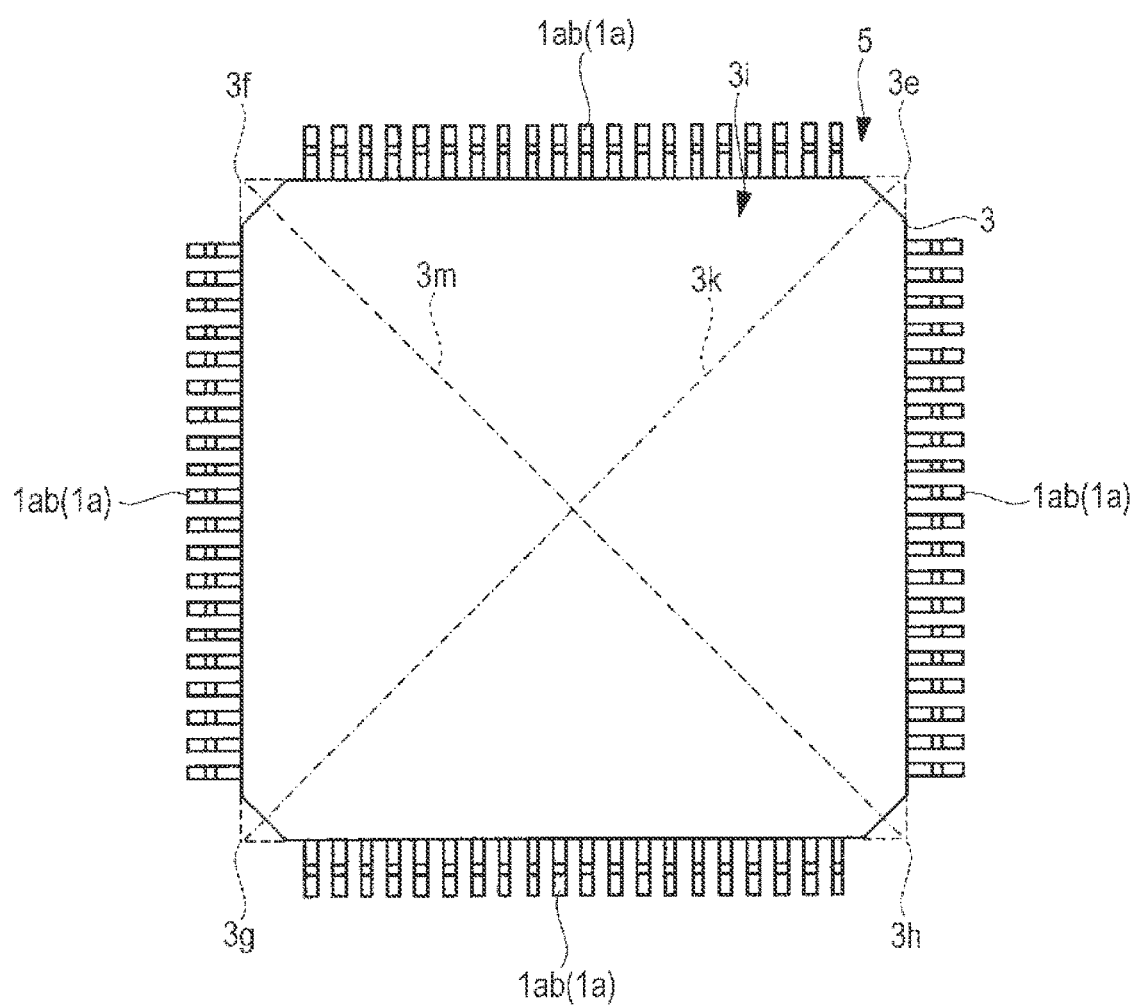
FIG. 1 is a plan view illustrating an example of a structure of a semiconductor device according to an embodiment.

In the following embodiments, a description of identical or similar members is not repeated in principle unless explicitly state otherwise.

The following embodiments are divided into a plurality of sections and embodiments, when necessary for the sake of convenience. Therefore, unless clearly indicated otherwise, the divided sections or embodiments are not irrelevant to one another, but one section or embodiment has a relation of modifications, details and supplementary explanations to some or all of the other embodiments.

Furthermore, there is no need to say that, in the following embodiments, the components (including component steps, etc.) are not always essential, unless clearly specified otherwise and considered to be definitely essential in principle.

Furthermore, there is no need to say that, in the following embodiments, the components (including component steps, etc.) are not always essential, unless clearly specified otherwise and considered to be definitely essential in principle.

Also, when that the components "are formed of A", "are configured by A", "have A", and "include A" are mentioned in the following embodiments, it is needless to say that the other components are not excluded, particularly unless clearly stating only the components. Similarly, when shapes and positional relationships, etc. of the components are mentioned in the following embodiments, the components will have shapes substantially analogous or similar to their shapes or the like, unless clearly defined otherwise and considered not to be definite in principle. This is applied likewise to the above-described numerical values and ranges as well.

Hereinafter, the embodiments will be described in detail with reference to the accompanying drawings. In addition, in all the drawings for explaining the embodiments, the same components are indicated by the same reference numerals in principle, and so a repeated description thereof will be omitted. Also, hatching may be used even in plan views to make it easy to read the drawings.

Embodiment

Figure 2:
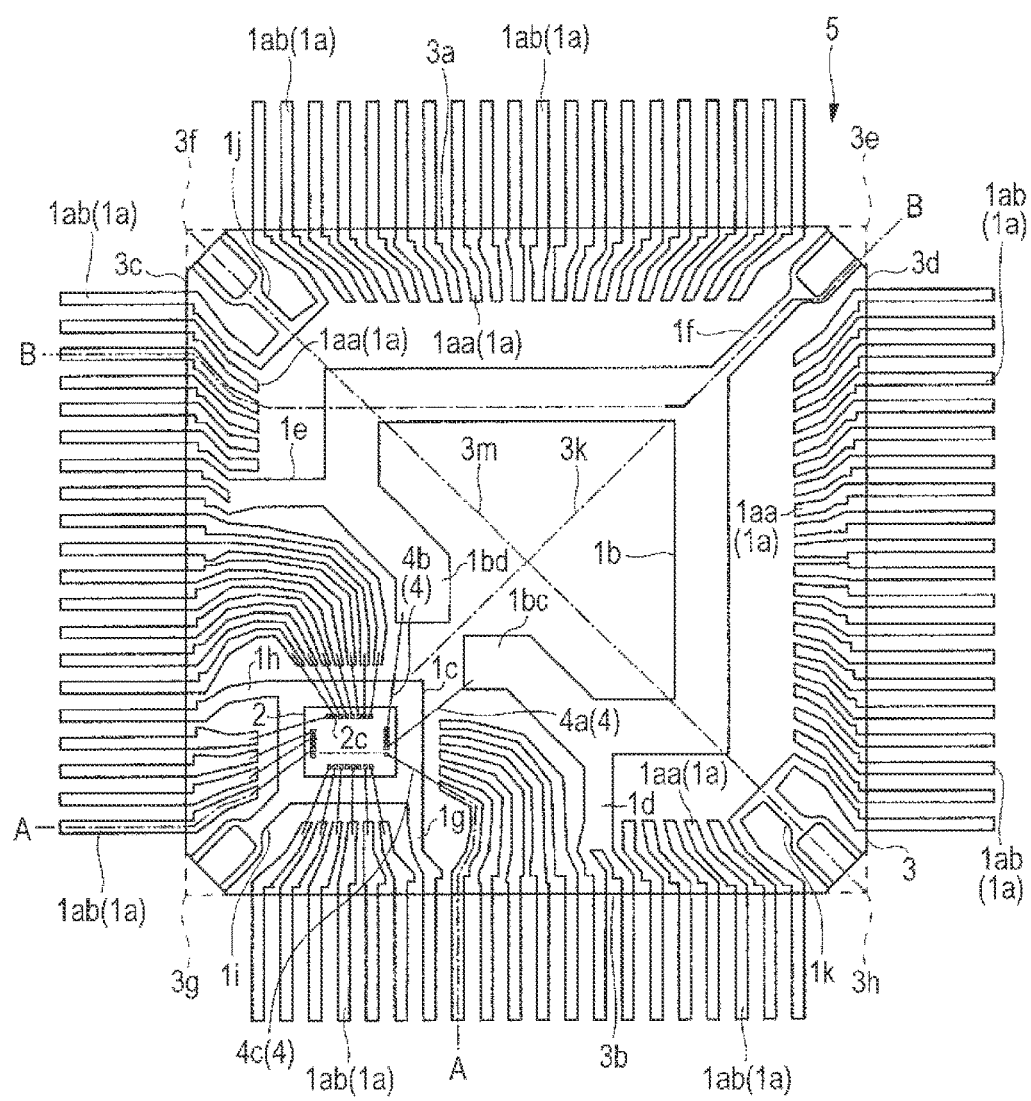
FIG. 2 is a plan view illustrating a structure of a semiconductor device illustrated in FIG. 1 through a sealing body.
Figure 3:
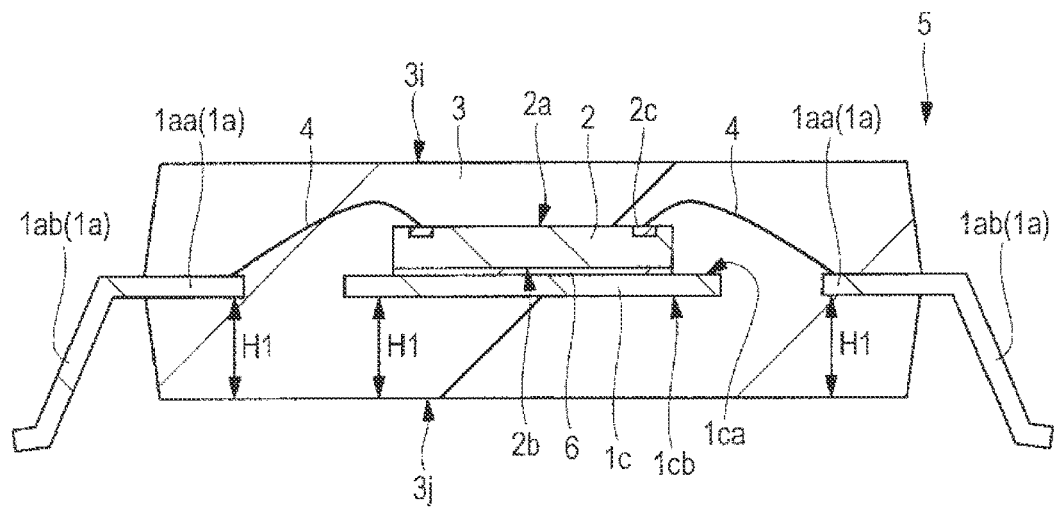
FIG. 3 is a cross-sectional view illustrating a structure cut along a line A-A illustrated in FIG. 2.
Figure 4:
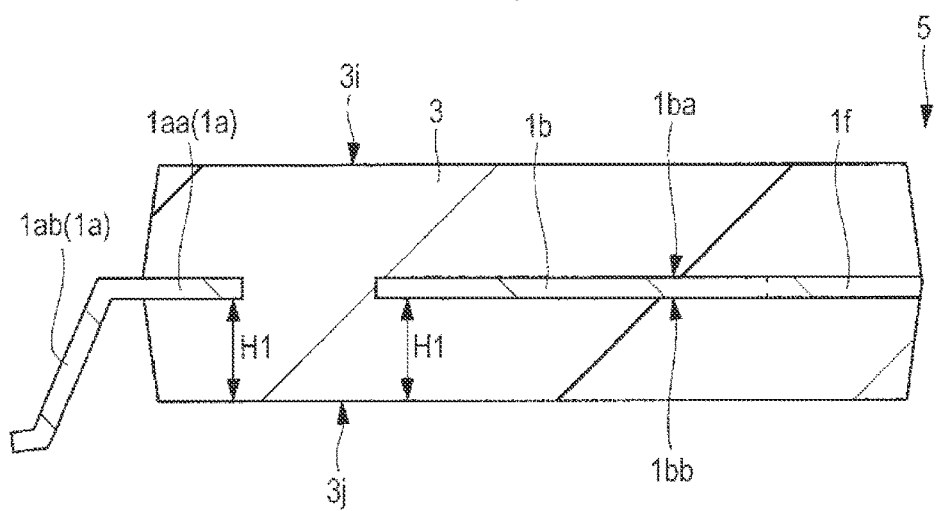
FIG. 4 is a cross-sectional view illustrating a structure cut along a line B-B illustrated in FIG. 2.
Figure 5:
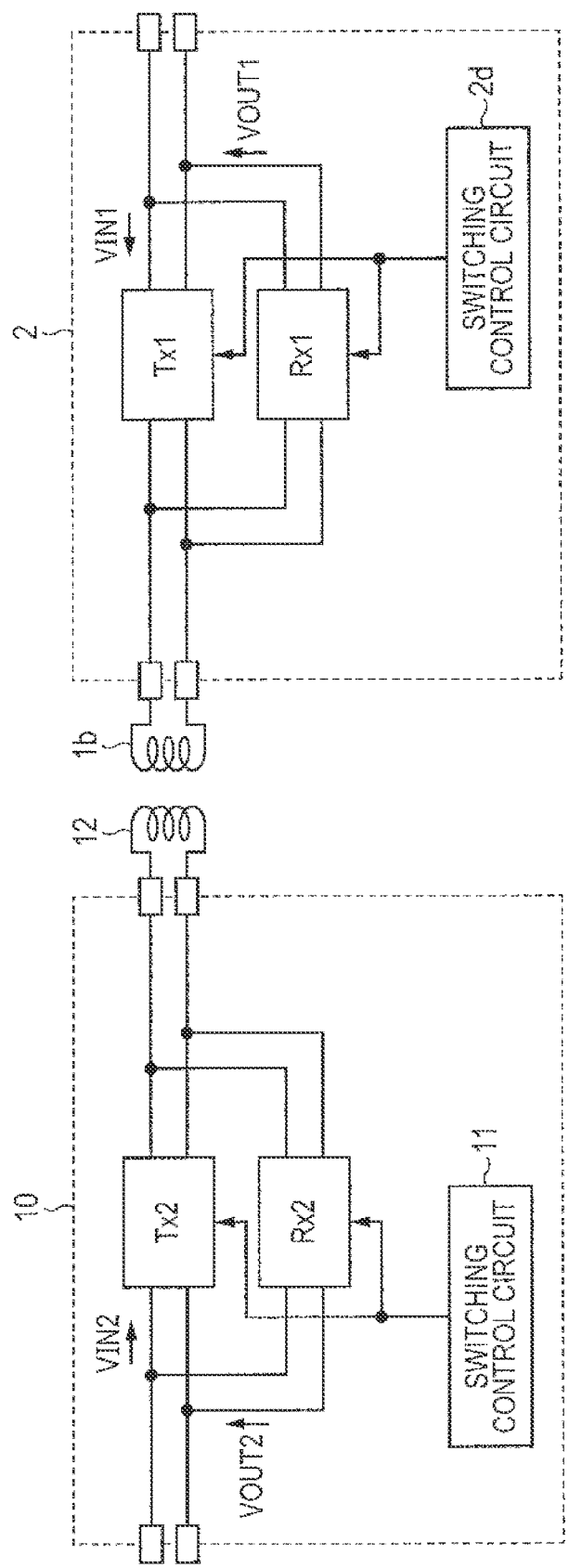
FIG. 5 is a circuit configuration diagram illustrating an example of a configuration of a semiconductor chip mounted on the semiconductor device illustrated in FIG. 1.
Figure 6:
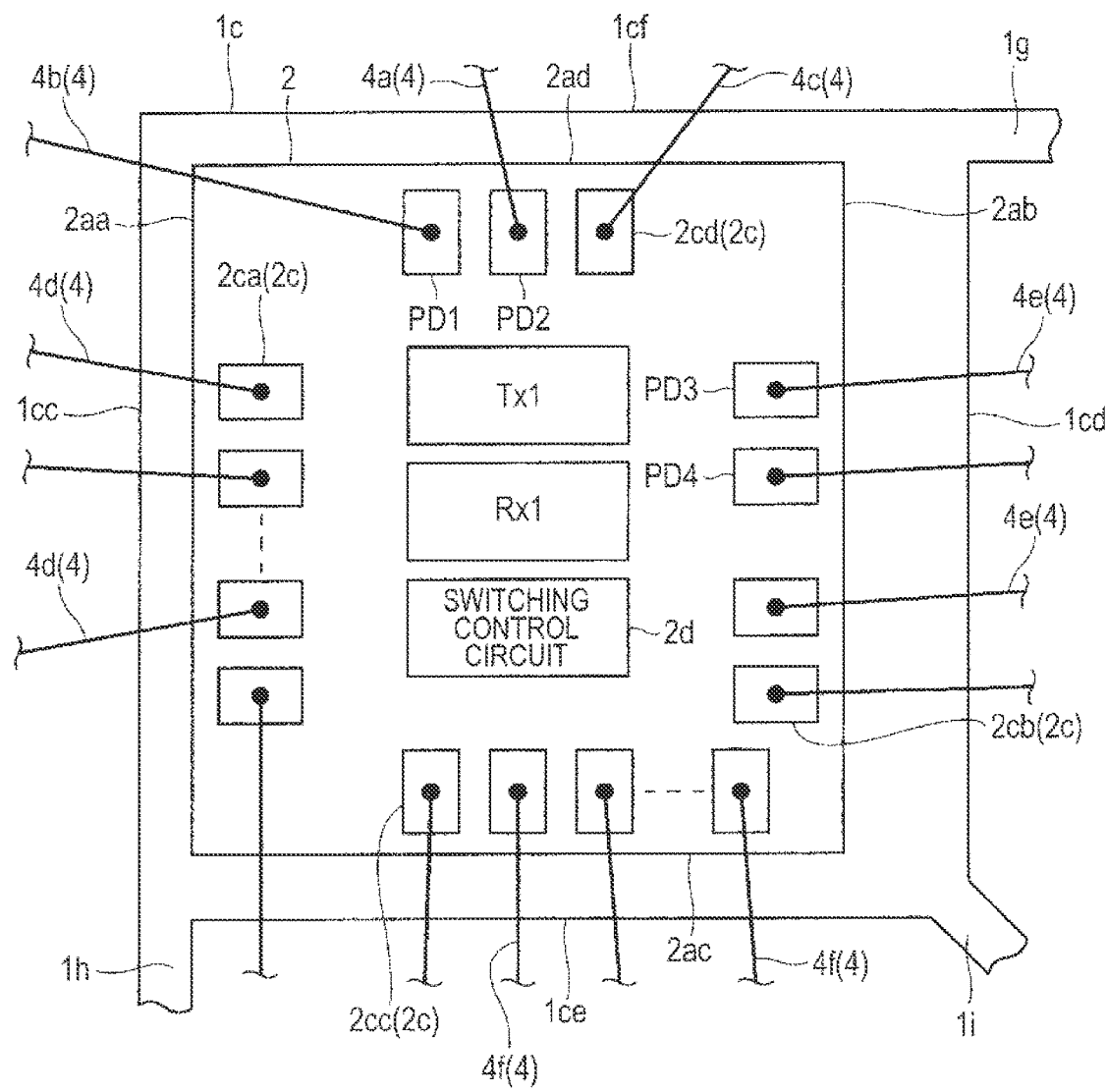
FIG. 6 is a partial plan view illustrating an example of a pad arrangement of the semiconductor chip mounted on the semiconductor device illustrated in FIG. 1.
Figure 7:
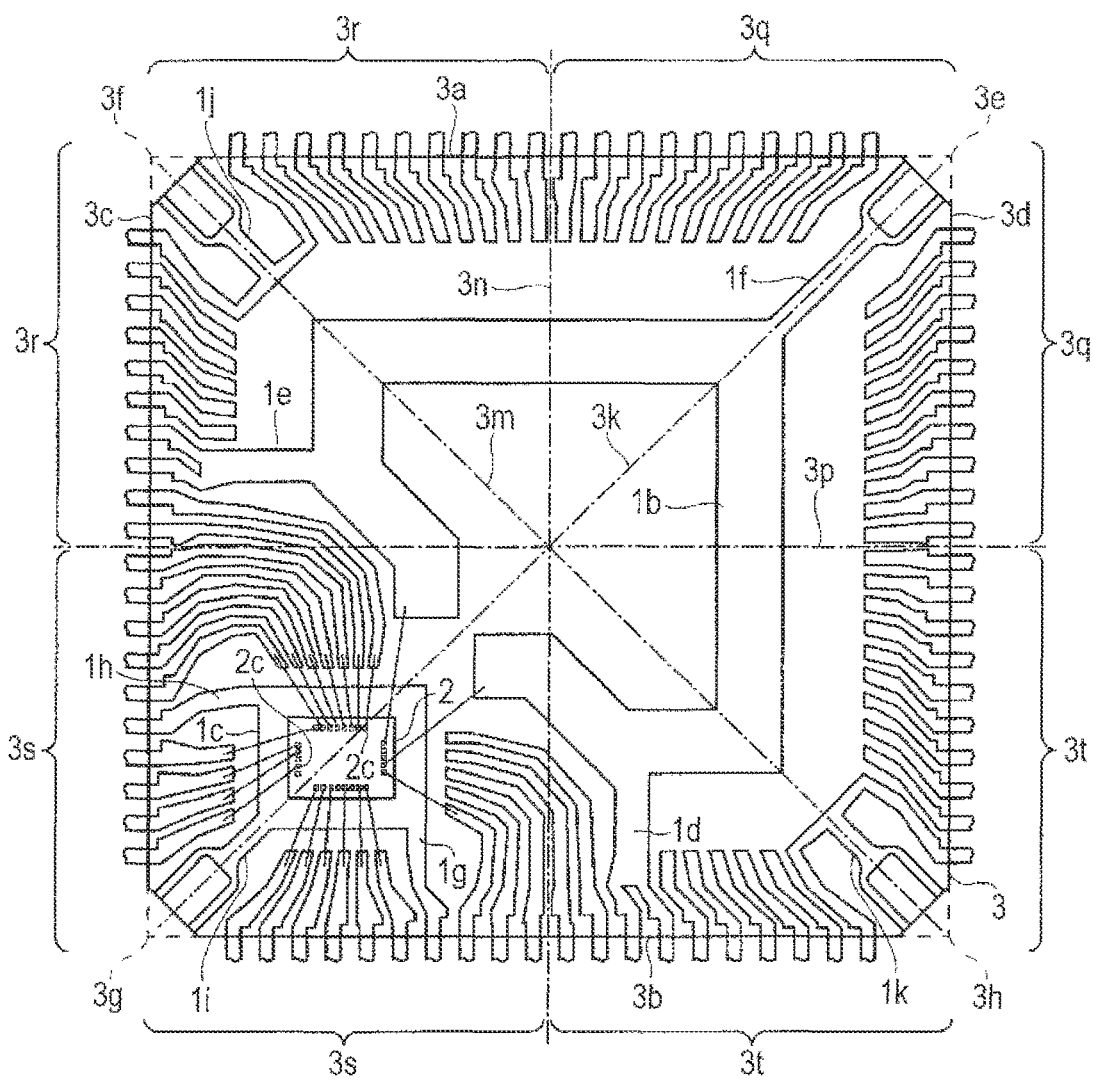
FIG. 7 is a partial plan view illustrating an example of an region of a main body (sealing body) of the semiconductor device illustrated in FIG. 1.
Figure 8:
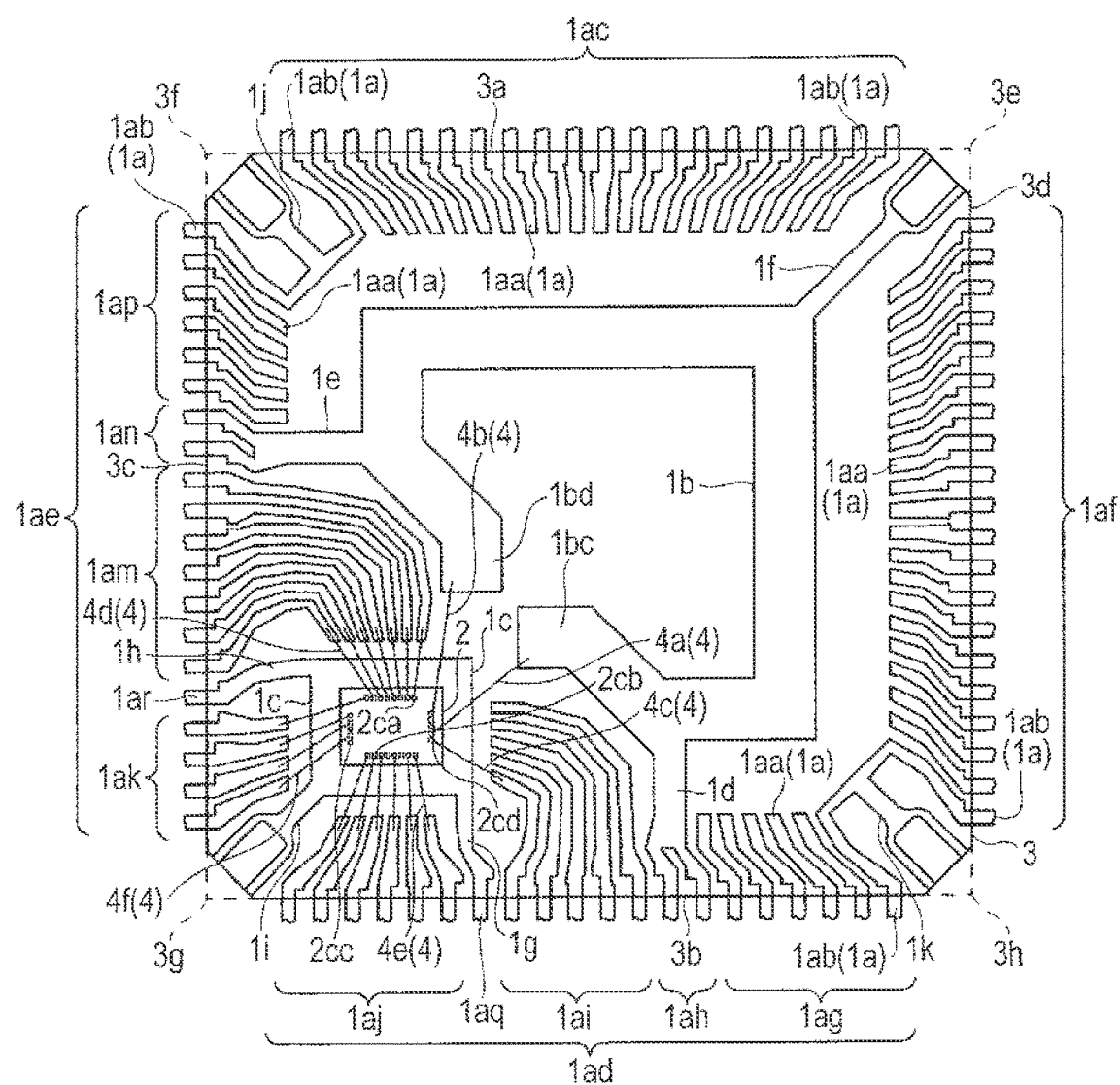
FIG. 8 is a partial plan view illustrating an example of a layout of terminal portions of the semiconductor device illustrated in FIG. 1.
Figure 9:
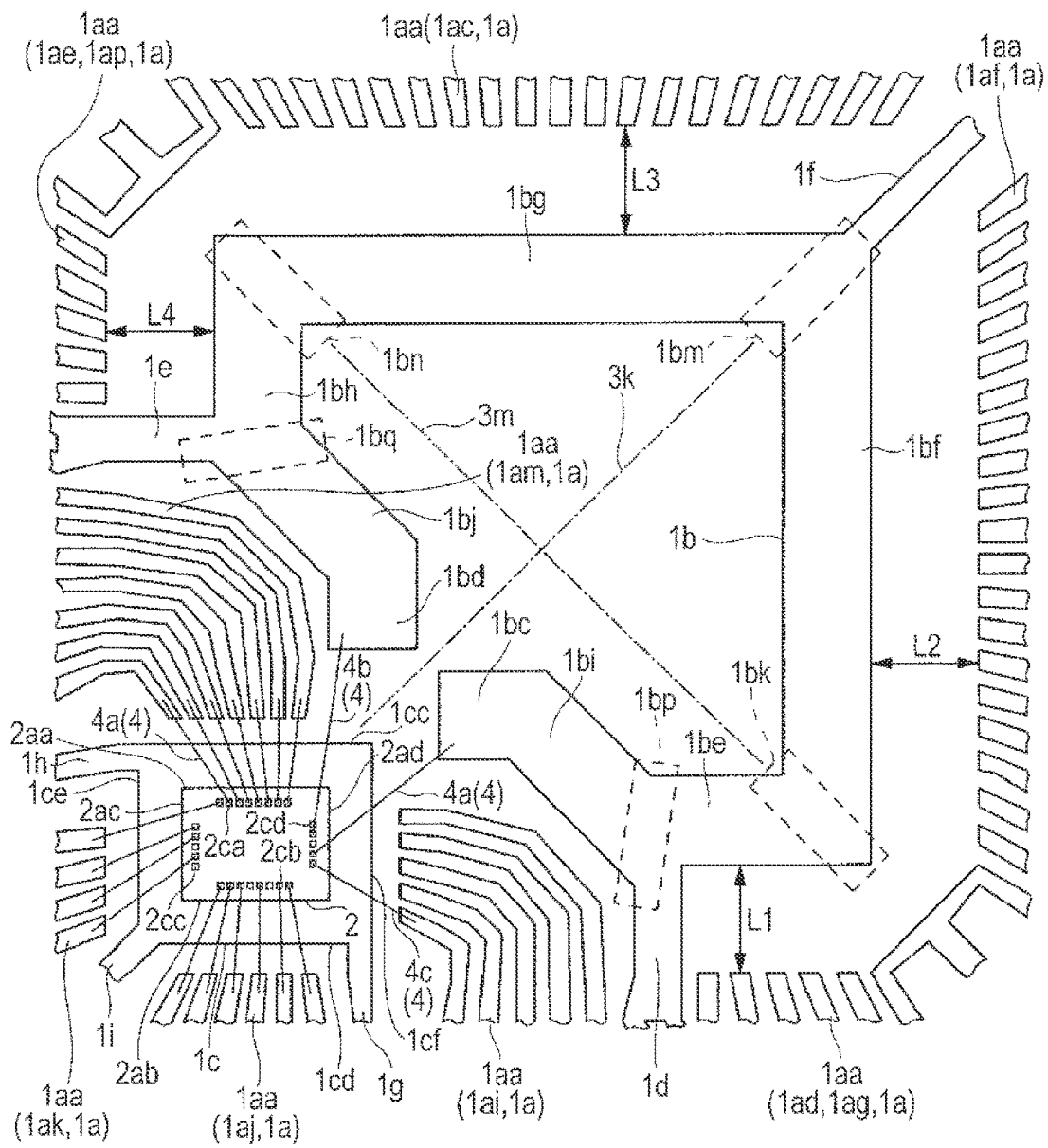
FIG. 9 is a partial plan view illustrating an example of an region of an antenna (frame body) of the semiconductor device illustrated in FIG. 1.

FIG. 1 is a plan view illustrating an example of a structure of a semiconductor device according to an embodiment. FIG. 2 is a plan view illustrating a structure of a semiconductor device illustrated in FIG. 1 through a sealing body. FIG. 3 is a cross-sectional view illustrating a structure cut along a line A-A illustrated in FIG. 2. FIG. 4 is a cross-sectional view illustrating a structure cut along a line B-B illustrated in FIG. 2. FIG. 5 is a circuit configuration diagram illustrating an example of a configuration of a semiconductor chip mounted on the semiconductor device illustrated in FIG. 1. FIG. 6 is a partial plan view illustrating an example of a pad arrangement of the semiconductor chip mounted on the semiconductor device illustrated in FIG. 1. FIG. 7 is a partial plan view illustrating an example of an region of a main body (sealing body) of the semiconductor device illustrated in FIG. 1. FIG. 8 is a partial plan view illustrating an example of a layout of terminal portions of the semiconductor device illustrated in FIG. 1. FIG. 9 is a partial plan view illustrating an example of an region of an antenna (frame body) of the semiconductor device illustrated in FIG. 1.

The semiconductor device according to this embodiment illustrated in FIGS. 1 and 2 is a semiconductor package of a resin seal type having an antenna (frame body) $1b$ therein. In this example, a QFP (quad flat package) 5 in which a plurality of, outer portions (first portions, electrode terminal portions, external connection terminals) $1ab$ projected from a sealing body 3 made of a resin material toward respective four directions is bent into a gull wing shape will be described as an example.

That is, the antenna $1b$ is embedded within the sealing body 3, and mounted on, for example, an in-vehicle ECU (electronic control unit). The ECU is a unit used for engine control or air conditioner control, and a semiconductor device (QFP 5) in which the antenna $1b$ is embedded according to this embodiment is mounted in the ECU to conduct a wireless communication (transmission and reception) between the semiconductor devices.

The QFP 5 according to this embodiment enables transmission and reception of a high frequency signal of, for example, 5 Gbps (5 GHz) class.

A structure of the QFP (semiconductor device) 5 illustrated in FIGS. 1 to 4 will be described.

The QFP 5 includes a die pad (island, support) $1c$ having an upper surface (chip mounting surface, main surface) $1ca$ and a lower surface (rear surface) $1cb$ opposite to the upper surface $1ca$, a semiconductor chip 2 mounted on the upper surface $1ca$ of the die pad $1c$, and having a plurality of electrode pads (electrodes) $2c$ disposed on a main surface $2a$, and a plurality of leads (terminal portions, electrodes) $1a$ arranged around the die pad $1c$.

Further, the QFP 5 is equipped with the antenna (frame body) $1b$ having a front surface (main surface) $1ba$, a rear surface $1bb$ opposite to the front surface $1ba$, a first end (first termination) $1bc$ illustrated in FIG. 2, which is one end thereof, a second end (second termination) $1bd$ which is the other end, and a plurality of bends arranged between the first end $1bc$ and the second end $1bd$. The antenna $1b$ is supported by three suspension leads (a first suspension lead (first support bar) $1d$, a second suspension lead (second support bar) $1e$, and a third suspension lead (third support bar) $1f$).

Also, in the QFP 5, the electrode pads $2c$ of the semiconductor chip 2 and the frame body (antenna $1b$), and the electrode pads $2c$ of the semiconductor chip 2 and the terminal portions are electrically connected to each other by wires (conductive members, conductors) 4 made of metal. That is, any one of the electrode pads $2c$ of the semiconductor chip 2, and the first end $1bc$ of the antenna $1b$ are electrically connected to each other by a first wire (first conductive member, first conductor) $4a$. On the other hand, any one of the plural electrode pads $2c$ of the semiconductor chip 2, and the second end $1bd$ of the antenna $1b$ are electrically connected to each other by a second wire (second conductive member, second conductor) $4b$. Also, any one of the plural electrode pads $2c$ of the semiconductor chip 2 and any one of the plural terminal portions are electrically connected to each other by a plurality of third wires (third conductive member, third conductor) $4c$.

With the above configuration, the frame body (antenna $1b$), the first wire $4a$, and the second wire $4b$ form a loop antenna through the semiconductor chip 2.

The wires 4 are formed of, for example, gold (Au) lines or copper (Cu) lines.

Also, the die pad $1c$, the semiconductor chip 2, the frame body (antenna $1b$), the three suspension leads (the first suspension lead $1d$, the second suspension lead $1e$, and the third suspension lead $1f$), and the plural wires 4 are sealed by the sealing body 3 made of a sealing resin. The sealing resin is, for example, a thermosetting epoxy resin.

Also, as illustrated in FIG. 3, the semiconductor chip 2 is mounted on the upper surface $1ca$ of the die pad $1c$ through a die bond material (adhesion layer, laminate adhesive, die bond film, DAF (die attach film)) 6.

That is, a rear surface $2b$ of the semiconductor chip 2 and the upper surface $1ca$ of the die pad $1c$ face each other, and are also joined together by the die bond material 6.

Also, as illustrated in FIG. 2, in the QFP 5, the third suspension lead 1f which is one of the three suspension leads that support the antenna 1b is arranged on a first virtual diagonal line 3k which is a diagonal line of a plan view of the sealing body 3.

Therefore, the antenna 1b is arranged to be symmetrical with respect to the first virtual diagonal line 3k of the sealing body 3.

The die pad 1c is supported by three other suspension leads except for the three suspension leads that support the antenna 1b.

That is, the die pad 1c is supported by three suspension leads of a fourth suspension lead (fourth support bar) 1g, a fifth suspension lead (fifth support bar) 1h, and a sixth suspension lead (sixth support bar) 1i.

Therefore, in the QFP 5, both of the die pad 1c and the antenna 1b are supported at respective three points.

Also, in the QFP 5, the antenna 1b, and the plural terminal portions (leads 1a) arranged on respective four sides of the sealing body 3 disposed around the antenna 1b are disposed at the substantially given distance.

The antenna 1b, the die pad 1c, the respective suspension leads, and the plural terminal portions (leads 1a) are made of an alloy material mainly containing copper.

Subsequently, the semiconductor chip 2 mounted on the QFP 5 according to this embodiment will be described.

As illustrated in FIGS. 2 and 3, the semiconductor chip 2 is mounted on the die pad 1c, and has at least any one of a transmitter circuit and a receiver circuit for conducting a wireless baseband transmission with the other semiconductor chip 10 (refer to FIG. 5) of the other semiconductor device. In this embodiment, an example in which the semiconductor chip 2 includes the transmitter circuit, the receiver circuit, and a switching control circuit that switches the transmission and reception of the signal will be described.

FIG. 5 illustrates an antenna 1b (one coil) disposed on the semiconductor chip 2 side, the other semiconductor chip 10 which is a communication target, and an antenna 12 (the other coil) disposed on the another semiconductor chip 10 side.

The semiconductor chip 2 illustrated in FIG. 5 includes a transmitter circuit Tx1, a receiver circuit Rx1, and a switching control circuit 2d. The other semiconductor chip 10 illustrated in FIG. 5 includes a transmitter circuit Tx2, a receiver circuit Rx2, and a switching control circuit 11. The antennas 1b and 12 (a pair of coils) are an AC coupling element that transmits an AC signal from one antenna to the other antenna, or from the other antenna to one antenna. That is, the semiconductor device having the semiconductor chip 2, and the semiconductor device having the semiconductor chip 10 are arranged to face each other without contact with each other, and conduct transmission and reception of the signal through the antennas 1b and 12. In this situation, the antennas 1b and 12 are magnetically coupled with each other.

First, a case in which the semiconductor, chip 2 transmits data to the semiconductor chip 10 will be described. In this case, the switching control circuit 2d drives the transmitter circuit Tx1, and stops the driving of the receiver circuit Rx1.

The transmitter circuit Tx1 converts transmission data VIN1 (differential signal) supplied from the external of the QFP 5 into a pulse signal, and outputs the pulse signal as a transmitted signal (differential signal). The transmitted signal is converted into a magnetic signal by the antenna 1b. The antenna 12 generates a received signal (differential signal) of a voltage level corresponding to a change in magnetic field of the antenna 1b, and delivers the received signal to the receiver circuit Rx2.

In this way, the transmitted signal output from the transmitter circuit Tx1 is transmitted to the receiver circuit Rx2 as the received signal through the AC coupling element configured by the antennas 1b and 12. The receiver circuit Rx2 reproduces the transmission data VIN1 on the basis of the received signal received from the antenna 12, and outputs the transmission data VIN1 as output data VOUT2 (differential signal).

Subsequently, a case in which the semiconductor chip 2 receives data transmitted from the semiconductor chip 10 will be described. In this case, the switching control circuit 2d drives the receiver circuit Rx1, and stops the driving of the transmitter circuit Tx1.

On the other hand, the transmitter circuit Tx2 disposed in the other semiconductor chip 10 converts transmission data VIN2 (differential signal) into a pulse signal, and outputs the pulse signal as a transmitted signal (differential signal). The transmitted signal is converted into a magnetic signal by the antenna 12. The antenna 1b generates a received signal (differential signal) of a voltage level corresponding to a change in magnetic field of the antenna 12, and delivers the received signal to the receiver circuit Rx1.

In this way, the transmitted signal output from the transmitter circuit Tx2 is transmitted to the receiver circuit Rx1 as the received signal through the AC coupling element configured by the antennas 1b and 12. The receiver circuit Rx1 reproduces the transmission data VIN2 on the basis of the received signal received from the antenna 1b, and outputs the transmission data VIN2 as output data VOUT1 (differential signal).

The semiconductor chip 2 can be appropriately changed into a circuit configuration provided in only the transmitter circuit Tx1 or the receiver circuit Rx1 in the transmitter circuit Tx1 and the receiver circuit Rx1.

Subsequently, the electrode pads 2c of the semiconductor chip 2 and the layout configuration of the circuit will be described with reference to FIG. 6. In an example illustrated in FIG. 6, the transmitter circuit Tx1, the receiver circuit Rx1, and the switching control circuit 2d are arranged in the center of the semiconductor chip 2. Also, the plural electrode pads 2c are arranged to surround the transmitter circuit Tx1, the receiver circuit Rx1, and the switching control circuit 2d in the periphery of the semiconductor chip 2.

The electrode pad 2c (first electrode pad PD1) connected to each of one output terminal of the transmitter circuit Tx1 and one input terminal of the receiver circuit Rx1 in the semiconductor chip 2 is arranged along any one of two sides arranged on the opposite side of the sixth suspension lead 1i that supports the die pad 1c among four sides of the semiconductor chip 2. In the example illustrated in FIG. 6, the first electrode pad PD1 is arranged in the vicinity of a corner on the opposite side of the sixth suspension lead 1i among four corners of the semiconductor chip 2.

Like the first electrode pad PD1, the electrode pad 2c (second electrode pad PD2) connected to each of the other output terminal of the transmitter circuit Tx1 and the other input terminal of the receiver circuit Rx1 is arranged along any one of two sides arranged on the opposite side of the sixth suspension lead 1i among four sides of the semiconductor chip 2. In the example illustrated in FIG. 6, the second electrode pad PD2 is arranged in the vicinity of the corner on the opposite side of the sixth suspension lead 1i among the four corners of the semiconductor chip 2. The first electrode pad PD1 and the second electrode pad PD2 are arranged adjacent to each other.

Also, the first electrode pad PD1 and one end (second end 1bd) of the antenna 1b (refer to FIG. 2) are electrically connected to each other through the second wire 4b (one of the plural wires 4). On the other hand, the second electrode pad PD2 and the other end (first end 1bc) of the antenna 1b are electrically connected to each other through the first wire 4a (one of the plural wires 4).

In this example, the first electrode pad PD1, the second electrode pad PD2, and one end and the other end of the antenna 1b are arranged in the vicinity of each other. Therefore, lengths of the first wire 4a and the second wire 4b are relatively short. As a result, in the wireless baseband transmission, the signal bandwidth is presented from being narrowed.

A third electrode pad PD3 connected to each of one input terminal of the transmitter circuit Tx1 and one output terminal of the receiver circuit Rx1 is arranged along at least any one of two sides closer to the sixth suspension lead 1i among four sides of the semiconductor chip 2.

Like the third electrode pad PD3, a fourth electrode pad PD4 connected to each of the other input terminal of the transmitter circuit Tx1 and the other output terminal of the receiver circuit Rx1 is arranged along at least any one of two sides closer to the sixth suspension lead 1i among the four sides of the semiconductor chip 2. In the example illustrated in FIG. 6, the third electrode pad PD3 and the fourth electrode pad PD4 are arranged along the same side of the semiconductor chip 2, and also arranged in the vicinity of each other.

In addition, like the third electrode pad PD3 and the fourth electrode pad PD4, the electrode pads 2c for supplying a control signal to the switching control circuit 2d from the external, and the electrode pads 2c for inputting and outputting a signal to another internal circuit from the external are also arranged along two sides closer to the sixth suspension lead 1i among the four sides of the semiconductor chip 2. Those electrode pads (including the third electrode pad PD3 and the fourth electrode pad PD4) other than the first electrode pad PD1 and the second electrode pad PD2 are connected to the respective terminal portions (leads 1a) close to each other through the wires 4.

Subsequently, the features of a structure of the QFP 5 according to this embodiment will be described in detail.

First, the sealing body 3 has a front surface (main surface) 3i, and a rear surface (mounting surface) 3j on the opposite side of the front surface 3i. As illustrated in FIG. 7, the sealing body 3 has a first side 3a on the front surface 3i (refer to FIG. 3), a second side 3b on the opposite side of the first side 3a, a third side 3c intersecting with the first side 3a, and a fourth side 3d on the opposite side of the third side 3c, in a plan view.

Also, the third suspension lead 1f arranged to overlap with the first virtual diagonal line 3k which is one of the virtual diagonal lines extends toward a first corner 3e formed by the first side 3a and the fourth side 3d. In detail, the first corner 3e is a portion where an extension of the first side 3a of the sealing body 3 intersects with an extension of the fourth side 3d.

Also, a second corner 3f on the opposite side of the first side 3a from the first corner 3e is formed by the first side 3a and the third side 3c. In detail, the second corner 3f is a portion where an extension of the first side 3a of the sealing body 3 intersects with an extension of the third side 3c.

Also, a third corner 3g on the opposite side of the third side 3c from the second corner 3f is formed by the second side 3b and the third side 3c. In detail, the third corner 3g is a portion where an extension of the third side 3c of the sealing body 3 intersects with an extension of the second side 3b.

Also, a fourth corner 3h on the opposite side of the fourth side 3d from the first corner 3e is formed by the second side 3b and the fourth side 3d. In detail, the fourth corner 3h is a portion where an extension of the second side 3b of the sealing body 3 intersects with an extension of the fourth side 3d.

Therefore, in the plan view of the sealing body 3, a diagonal line that passes through the first corner 3e and the third corner 3g in the two diagonal lines is the first virtual diagonal line 3k, and a diagonal line that passes through the second corner 3f and the fourth corner 3h is a second virtual diagonal line 3m.

Also, in the plan view of the sealing body 3, when it is assumed that a line that divides each of the first side 3a and the second side 3b into two equal parts is a first virtual line 3n, and a line that divides each of the third side 3c and the fourth side 3d into two equal parts is a second virtual line 3p, the sealing body 3 has a first region 3q surrounded by the first side 3a, the fourth side 3d, the first virtual line 3n, and the second virtual line 3p.

Further, the sealing body 3 has a second region 3r surrounded by the first side 3a, the third side 3c, the first virtual diagonal line 3n, and the second virtual line 3p. Also, the sealing body 3 has a third region 3s surrounded by the second side 3b, the third side 3c, the first virtual line 3n, and the second virtual line 3p. Also, the sealing body 3 has a fourth region 3t surrounded by the second side 3b, the fourth side 3d, the first virtual line 3n, and the second virtual line 3p.

The die pad 1c is arranged within the sealing body 3, and has a first side 1cc on the upper surface (chip mounting surface, main surface, front surface (refer to FIG. 3)) 1ca, a second side 1cd opposite to the first side 1cc, a third side 1ce that intersects with the second side 1cd, and a fourth side 1cf opposite to the third side ice, in a plan view of FIG. 9.

Likewise, the semiconductor chip 2 is arranged within the sealing body 3, and has a first side 2aa on the main surface 2a, a second side 2ab located opposite to the first side 2aa, a third side 2ac that intersects with the first side 2aa and the second side 2ab, and a fourth side 2ad located opposite to the third side 2ac, in the plan view. Further, the main surface 2a is formed with the plurality of electrode pads 2c (refer to FIG. 7).

The plural electrode pads 2c of the semiconductor chip 2 include a plurality of first electrode pads 2ca arranged along the first side 2aa of the semiconductor chip 2, a plurality of second electrode pads 2cb arranged along the second side 2ab, a plurality of third electrode pads 2cc arranged along the third side 2ac, and a plurality of fourth electrode pads 2cd arranged along the fourth side 2ad.

Also, as illustrated in FIG. 8, the QFP 5 according to this embodiment includes a plurality of first leads (first terminal portions, first electrodes) 1ac each having an inner portion (first portion) 1aa which is arranged along the first side 3a of the sealing body 3, and sealed by the sealing body 3, and an outer portion (second portion) 1ab that is exposed from the sealing body 3, in the plan view.

Further, the QFP 5 includes a plurality of second leads (second terminal portions, second electrodes) 1ad each having the inner portion (first portion) 1aa which is arranged along the second side 3b of the sealing body 3, and sealed by the sealing body 3, and the outer portion (second portion) 1ab that is exposed from the sealing body 3.

Also, the QFP 5 includes a plurality of third leads (third terminal portions, third electrodes) 1ae each having the inner portion (first portion) 1aa which is arranged along the third side 3c of the sealing body 3, and sealed by the sealing body 3, and the outer portion (second portion) 1ab that is exposed from the sealing body 3.

Further, the QFP 5 includes a plurality of fourth leads (fourth terminal portions, fourth electrodes) 1af each having the inner portion (first portion) 1aa which is arranged along the fourth side 3d of the sealing body 3, and sealed by the sealing body 3, and the outer portion (second portion) 1ab that is exposed from the sealing body 3.

The plurality of second leads 1ad arranged along the second side 3b of the sealing body 3 includes a plurality of first electrode terminals 1ag, a plurality of second electrode terminals 1ah, a plurality of third electrode terminals 1ai, and a plurality of fourth electrode terminals 1aj.

Also, the plurality of third leads 1ae arranged along the third side 3c of the sealing body 3 includes a plurality of fifth electrode terminals 1ak, a plurality of sixth electrode terminals 1am, a plurality of seventh electrode terminals 1an, and a plurality of eighth electrode terminals 1ap.

The antenna (frame body) 1b is supported by the first suspension lead 1d connected with the plural second electrode terminals 1ah, a second suspension lead 1e connected with the plural seventh electrode terminals 1an, and a third suspension lead 1f extending to the first corner 3e from the antenna 1b along the first virtual diagonal line 3k in the first region 3q illustrated in FIG. 7.

Also, the first end 1bc and the second end 1bd in the antenna 1b are arranged in the third region 3s illustrated in FIG. 7 so as to face each other.

Also, the die pad 1c is supported by the fourth suspension lead 1g connected with a ninth electrode terminal 1aq located between the plural third electrode terminals 1ai and the plural fourth electrode terminals 1aj, the fifth suspension lead 1h connected with a tenth electrode terminal 1ar located between the plural fifth electrode terminals 1ak and the plural sixth electrode terminals 1am, and the sixth suspension lead 1i extending toward the third corner 3g in the above third region 3s. The sixth suspension lead 1i extends from the die pad 1c toward the third corner 3g along the first virtual diagonal line 3k.

In other words, the die pad 1c is supported at three points by the fourth suspension lead 1g extending toward the second side 3b of the sealing body 3, the fifth suspension lead 1h extending toward the third side 3c of the sealing body 3, and the sixth suspension lead 1i extending toward the third corner 3g of the sealing body 3.

Also, in the plan view, the die pad 1c and the semiconductor chip 2 are arranged in the above third region 3s of the sealing body 3.

As illustrated in FIG. 8, among the plural electrode pads 2c (refer to FIG. 7) disposed in the semiconductor chip 2, the first electrode pads 2ca are electrically connected to the sixth electrode terminals 1am through fourth wires (fourth conductive members, fourth conductors) 4d. Further, the second electrode pads 2cb are electrically connected to the fourth electrode terminals 1aj through fifth wires (fifth conductive members, fifth conductors) 4e. Also, the third electrode pads 2cc are electrically connected to the fifth electrode terminals 1ak through sixth wires (sixth conductive members, sixth conductors) 4f. Further, the fourth electrode pads 2cd are electrically connected to the third electrode terminals 1ai through the third wires (third conductive members, third conductors) 4c. The fourth electrode pads 2cd is also electrically connected to the first end (first termination) 1bc of the antenna 1b through the first wire (first conductive member, first conductor) 4a. The fourth electrode pads 2cd is further electrically connected to the second end (second termination) 1bd of the antenna 1b through the second wire (second conductive member, second conductor) 4b.

Also, the first suspension lead 1d among the three suspension leads that support the antenna 1b extends toward the second side 3b of the sealing body 3, and is connected to the second electrode terminals 1ah arranged on the second side 3b. On the other hand, the second suspension lead 1e among the three suspension leads that support the antenna 1b extends toward the third side 3c of the sealing body 3, and is connected to the seventh electrode terminals 1an arranged on the third side 3c.

Also, as illustrated in FIGS. 7 and 8, the QFP 5 is equipped with a first bar lead (suspension lead, support bar) 1j having one end extended toward the second corner 3f of the sealing body 3 along the second virtual diagonal line 3m, and the other end connected to the first leads 1ac and the eighth electrode terminals 1ap of the third leads 1ae, in the second region 3r of the sealing body 3 in the plan view.

That is, the first bar lead 1j extended toward the second corner 3f of the sealing body 3 is located outside of the antenna 1b in the second region 3r. The first bar lead 1j is biforked toward the outside of the sealing body 3, and also connected to the first leads 1ac and the third leads 1ae which are arranged on ends of the respective terminal portion arrays of the first side 3a and the third side 3c of the sealing body 3.

Likewise, the QFP 5 is equipped with a second bar lead (suspension lead, support bar) 1k having one end extended toward the fourth corner 3h of the sealing body 3, along the second virtual diagonal line 3m, and the other end connected to the fourth leads 1af and the first electrode terminals 1ag of the second leads 1ad, in the fourth region 3t of the sealing body 3 in the plan view.

That is, the second bar lead 1k extended toward the fourth corner 3h of the sealing body 3 is located outside of the antenna 1b in the fourth region 3t. The second bar lead 1k is also biforked toward the outside of the sealing body 3, and also connected to the second leads 1ad and the fourth leads 1af which are arranged on ends of the respective terminal portion arrays of the second side 3b and the fourth side 3d of the sealing body 3.

Also, as illustrated in FIG. 9, the antenna (frame body) 1b includes a first frame portion 1be disposed along (disposed in parallel to) the second side 3b of the sealing body 3 (refer to FIG. 8), and a second frame portion 1bf disposed along (disposed in parallel to) the fourth side 3d of the sealing body 3, which is connected to the first frame portion 1be through a first bend 1bk. Further, the antenna 1b includes a third frame portion 1bg disposed along (disposed in parallel to) the first side 3a of the sealing body 3, which is connected to the second frame portion 1bf through a second bend 1bm, and a fourth frame portion 1bh disposed along (disposed in parallel to) the third side 3c of the sealing body 3, which is connected to the third frame portion 1bg through a third bend 1bn.

Further, the first frame portion 1be of the antenna 1b has one end and the other end. One end of the first frame portion 1be is connected to the first bend 1bk. On the other hand, the other end of the first frame portion 1be is connected to a fifth frame portion 1bi along (parallel to) the second virtual diagonal line 3m through a fourth bend 1bp.

Likewise, the fifth frame portion 1bi of the antenna 1b has one end and the other end. One end of the fifth frame portion 1bi is connected to the fourth bend 1bp. On the other hand, the other end of the fifth frame portion 1*bi* is connected to the first end (first termination) 1*bc*.

Likewise, the fourth frame portion 1*bh* of the antenna 1*b* has one end and the other end. One end of the fourth frame portion 1*bh* is connected to the third bend 1*bn*. On the other hand, the other end of the fourth frame portion 1*bh* is connected to a sixth frame portion 1*bj* along (parallel to) the second virtual diagonal line 3*m* through a fifth bend 1*bq*.

Likewise, the sixth frame portion 1*bj* of the antenna 1*b* has one end and the other end. One end of the sixth frame portion 1*bj* is connected to the fifth bend 1*bq*. On the other hand, the other end of the sixth frame portion 1*bj* is connected to the second end (second termination) 1*bd*.

The antenna 1*b*, the first wire 4*a*, and the second wire 4*b* form a loop antenna through the semiconductor chip 2, and the directivity can be enhanced with the application of the loop antenna. The loop shape of the loop antenna can be square or hexagon, but a circular shape of the loop antenna has the largest gain. That is, the loop shape is substantially shaped into a circle, and a size (diameter) of the loop is increased as large as possible, thereby leading to the large gain.

Under the circumstances, in the QFP 5 according to this embodiment, a size of an annular portion of the antenna (frame body) 1*b* is set to be as large as possible in an region inside of the plural inner portions 1*aa* arranged in the periphery of the sealing body 3, in the plan view, thereby being capable of increasing the gain of the loop antenna.

Also, the antenna (frame body) 1*b* in the above loop antenna of the QFP 5 is shaped to be symmetrical with respect to the first virtual diagonal line 3*k* as a center line in the plan view. That is, as illustrated in FIG. 8, the third suspension lead 1*f* is arranged on the first virtual diagonal line 3*k* in FIG. 7 so that the first suspension lead 1*d* and the second suspension lead 1*e* are further located symmetrically with respect to the third suspension lead 1*f*.

With the above configuration, the discontinuities of the wave of the signal caused by the third suspension lead 1*f* can be arranged substantially in the vicinity of a center of the loop shape of the antenna 1*b*, and the wave is shaped to be symmetrical with respect to a line so that a waveform of one wave of the high frequency signal can be shaped into a pure mountain.

This can make it difficult to generate noise, and the high frequency signal can be stabilized to enhance the quality of the signal.

Also, it is assumed that a distance between the first frame portion 1*be* and the plural first electrode terminals 1*ag* is L1 in a direction along (parallel to) the fourth side 3*d* of the sealing body 3 in FIG. 8 in the plan view of the QFP 5, and also a distance between the second frame portion 1*bf* and the plural fourth leads (fourth electrodes) 1*af* is L2 in a direction along (parallel to) the first side 3*a* of the sealing body 3 in the plan view. Further, it is assumed that a distance between the third frame portion 1*bg* and the plural first leads (first electrodes) 1*ac* is L3 in a direction along (parallel to) the fourth side 3*d* of the sealing body 3 in the plan view, and also a distance between the fourth frame portion 1*bh* and the plural eighth electrode terminals 1*ap* is L4 in a direction along (parallel to) the first side 3*a* of the sealing body 3 in the plan view. Then, L1=L2=L3=L4 is satisfied.

Stated another way, it is assumed that a distance between the plural first leads (first terminal portions, first electrodes) 1*ac* arranged on the first side 3*a* in the direction along (parallel to) the fourth side 3*d* of the sealing body 3, and the third frame portion (frame body) 1*bg* is L3, and a distance between the first electrode terminals 1*ag* among the plural second leads 1*ad* arranged on the second side 3*b* in the direction along the fourth side 3*d*, and the first frame portion (frame body) 1*be* is L1.

Further, it is assumed that a distance between the plural fourth leads 1*af* arranged on the fourth side 3*d* in the direction along (parallel to) the first side 3*a* of the sealing body 3, and the second frame portion 1*bf* is L2, and a distance between the eighth electrode terminals 1*ap* among the plural third leads 1*ae* arranged on the third side 3*c* in the direction along the first side 3*a*, and the fourth frame portion (frame body) 1*bh* is L4. Then, L3, L1, L2, and L4 become equal to one another.

That is, in the QFP 5, distances between the antenna 1*b* and the plural leads 1*a* arranged around the antenna 1*b* are substantially equal to each other in the plan view. In detail, the respective distances between a portion extended from the first suspension lead 1*d* to the second suspension lead 1*e* through the third suspension lead 1*f* in the antenna 1*b*, and the plural first electrode terminals 1*ag*, the fourth leads 1*af*, the first leads 1*ac*, and the eighth electrode terminals 1*ap*, which are arranged around that portion, are equal to each other, and also set to a desired distance or longer. Further, the antenna 1*b* is not also connected to the die pad 1*c*, and independent from the die pad 1*c*.

In the QFP 5 according to this embodiment, as illustrated in FIG. 8, the plural first leads 1*ac* arranged on the first side 3*a* of the sealing body 3, and the plural fourth leads 1*af* arranged on the fourth side 3*d* of the sealing body 3 are dummy electrodes (dummy leads). The dummy electrodes are not particularly electrically connected, and apparently provided for the purpose of stabilizing the mounting of the QFP 5.

Also, the first electrode terminals 1*ag* which are parts of the terminal portions among the plural second leads 1*ad* arranged on the second side 3*b* of the sealing body 3, and the eighth electrode terminals 1*ap* which are parts of the terminal portions among the plural third leads 1*ae* arranged on the third side 3*c* of the sealing body 3 are also dummy electrodes.

Further, in the second side 3*b* of the sealing body 3, the third electrode terminals 1*ai* not connected with the wires 4, and the ninth electrode terminal 1*aq* connected to the fourth suspension lead 1*g* that support the die pad 1*c* are also dummy electrodes. Also, in the third side 3*c* of the sealing body 3, the tenth electrode terminal 1*ar* connected to the fifth suspension lead 1*h* that supports the die pad 1*c* is also the dummy electrode.

That is, in the QFP 5, all of the plural leads 1*a* not connected with the wires 4, and the plural leads 1*a* not involved in the antenna 1*b* are dummy electrodes. Those dummy electrodes are leads necessary only for mounting the QFP 5.

Also, in the QFP 5 according to this embodiment, as illustrated in FIGS. 3 and 4, the die pad 1*c* and the antenna 1*b* are arranged at the same height H1 in a cross-sectional view taken along the same direction as the thickness direction of the sealing body 3.

That is, the die pad 1*c* and the antenna 1*b* are flush with each other in the cross-sectional view taken along the same direction as the thickness direction of the sealing body 3. This is because the antenna 1*b*, the respective suspension leads that support the antenna 1*b*, the die pad 1*c*, the respective suspension leads that support the die pad 1*c*, and all of the leads 1*a* arranged in the periphery of the sealing body 3, which are disposed in the QFP 5, are not subjected to bending work at all. That is, in the QFP 5 according to this embodiment, all of the respective suspension leads and the respective leads 1a are flushed with each other.

In the QFP 5 according to this embodiment, the antenna (frame body) 1b is supported by the three suspension leads, and any one of those three suspension leads is arranged on the virtual diagonal line, and the antenna 1b is arranged to be symmetrical with respect to the virtual diagonal line in the plan view of the sealing body 3. As a result, the discontinuities of the wave of the high frequency signal in the antenna 1b can be reduced.

That is, when the number of portions (for example, suspension leads) at which antenna 1b is supported is larger, the wave of the high frequency signal is discontinuous at the support portions, and a reflected wave is generated in the support portions. Also, a resistance value of the frame is changed at the portions for supporting the antenna 1b. Those factors cause noise to be generated.

Under the circumstances, in the QFP 5 according to this embodiment, the number of suspension leads that support the antenna 1b is reduced to three with the result that the discontinuities of the wave of the high frequency signal can be reduced.

With the above configuration, the generation of noise can be reduced, and the degradation of the quality of the high frequency signal can be suppressed.

Also, the third suspension lead 1f among the three suspension leads that support the antenna 1b is arranged on the first virtual diagonal line 3k, and the antenna 1b is arranged to be symmetrical with respect to the first virtual diagonal line 3k in the plan view of the sealing body 3. As a result, the discontinuities caused by the third suspension lead 1f can be arranged in the vicinity of the center of the loop shape of the antenna 1b.

Further, the antenna 1b is arranged to be symmetrical with respect to the first virtual diagonal line 3k with the result that the shape of the waveform of the high frequency signal for one wavelength can be shaped into a pure mountain.

That is, the antenna 1b is supported by the three suspension leads taking the symmetry of the shape of the antenna 1b into account with the results that the distortion of the receiving waveform can be suppressed, and the baseband transmission in the QFP 5 can be conducted.

As a result, noise can be difficult to generate, and the high frequency signal can be stabilized to enhance the quality of the high frequency signal. With the above configuration, the high frequency signal of 5 Gbps class can be transmitted and received in the QFP 5.

Also, the respective distances between a portion extending from the first suspension lead 1d to the second suspension lead 1e through the third suspension lead 1f in the antenna 1b, and the plural first electrode terminals 1ag, the fourth leads 1af, the first leads 1ac, and the eighth electrode terminals 1ap, which are arranged around that portion, are equal (kept constant) to each other, and set to a desired distance or longer. Further, the antenna 1b is not connected to the die pad 1c, and independent from the die pad 1c.

With the above configuration, the high frequency signal can be prevented from interfering with the plural leads 1a (dummy electrodes) and the die pad 1c which are disposed around the antenna 1b. As a result, the high frequency signal can be stabilized to enhance the quality of the high frequency signal.

Also, each of the first bar lead 1j extending toward the second corner 3f of the sealing body 3, and the second bar lead 1k extending toward the fourth corner 3h is biforked into toward the outside of the sealing body 3. As a result, inflow of a sealing resin into upper and lower molds in a resin mold process for assembling the semiconductor device can be improved.

That is, each of the first bar lead 1j and the second bar lead 1k is biforked toward the outside, thereby enabling the sealing resin to pass through the biforked portion. As a result, because the sealing resin can pass through the biforked portion, the flow of the sealing resin into the upper and lower molds can be improved.

The first bar lead 1j and the second bar lead 1k are each not limited to the biforked shape, but may be configured by a single shape.

Also, the first bar lead 1j is connected to the first lead 1ac and the third lead 1ae arranged on ends of the respective terminal portion arrays of the first side 3a and the third side 3c of the sealing body 3. Likewise, the second bar lead 1k is connected to the second lead 1ad and the fourth lead 1af arranged on ends of the respective terminal portion arrays of the second side 3b and the fourth side 3d of the sealing body 3.

That is, each of the two bar leads is connected to the leads 1a arranged adjacent to both sides of each bar lead within the sealing body 3. In a package singulation process for assembling the semiconductor device, the bar lead is pulled outside by a cutting blade, and projected from the sealing body 3 at the time of cutting the leads, thereby being capable of preventing a problem that a gap is formed in the sealing body 3 from being generated. As a result, the degradation of the quality of the QFP 5 and a reduction in the reliability can be suppressed.

Also, the bar leads (first bar lead 1j, second bar lead 1k) are provided in each of the second corner 3f and the fourth corner 3h in the sealing body 3, as a result of which the sealing resin can be prevented from being leaked from the mold in the resin mold process for assembling the semiconductor device.

Further, the bar leads are disposed in each of the second corner 3f and the fourth corner 3h in the sealing body 3 with the result that the QFP 5 has the same structure as that of a standard package. For that reason, the QFP 5 can be assembled with the use of the same facility as that used for assembling the standard package, and the QFP 5 can be assembled in the same assembling method as that of the standard package.

Subsequently, a modification will be described.

Figure 10:
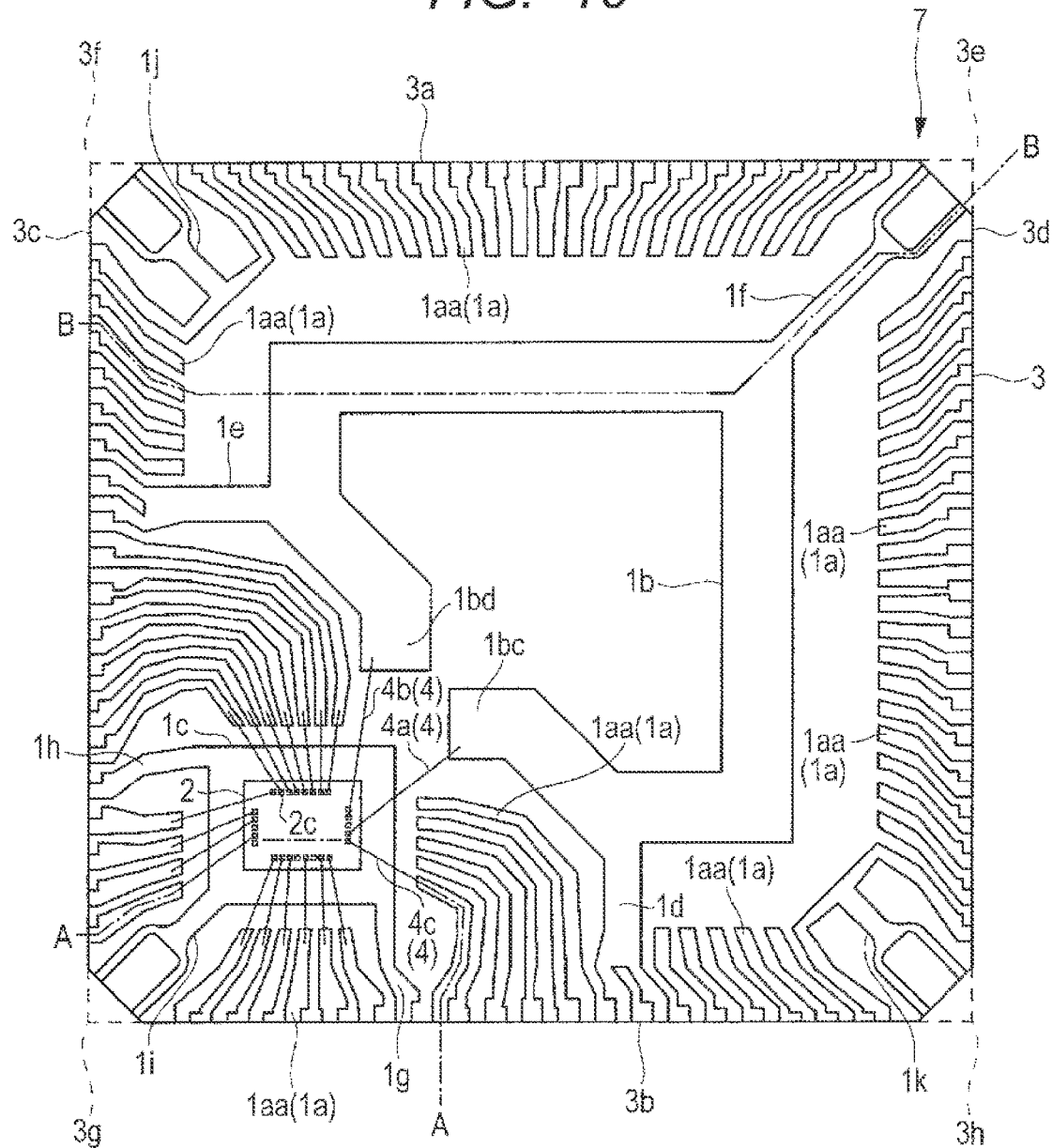
FIG. 10 is a plan view illustrating a structure of a semiconductor device through a sealing body according to a modification of the embodiment.
Figure 11:
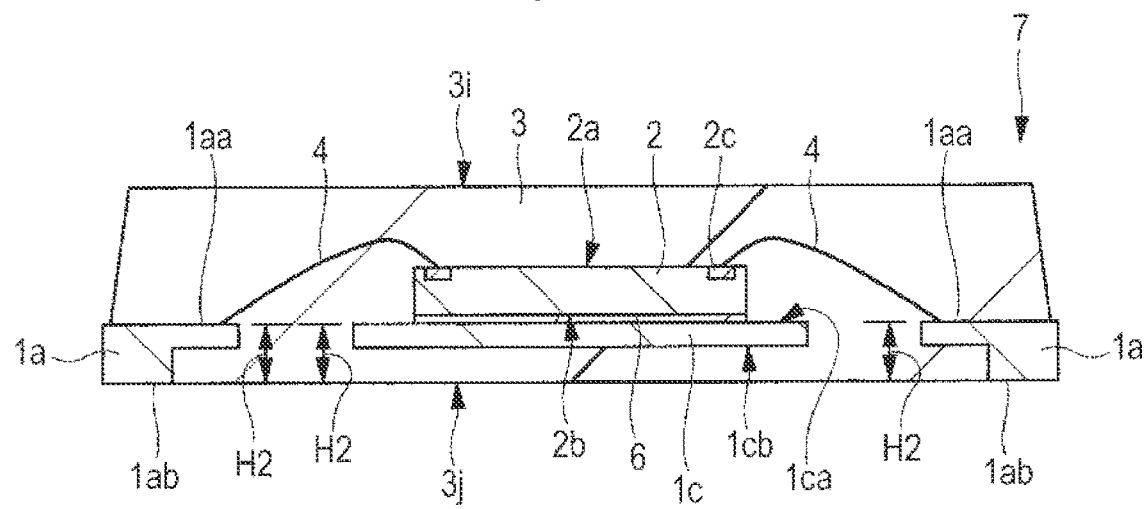
FIG. 11 is a cross-sectional view illustrating a structure cut along a line A-A illustrated in FIG. 10.
Figure 12:
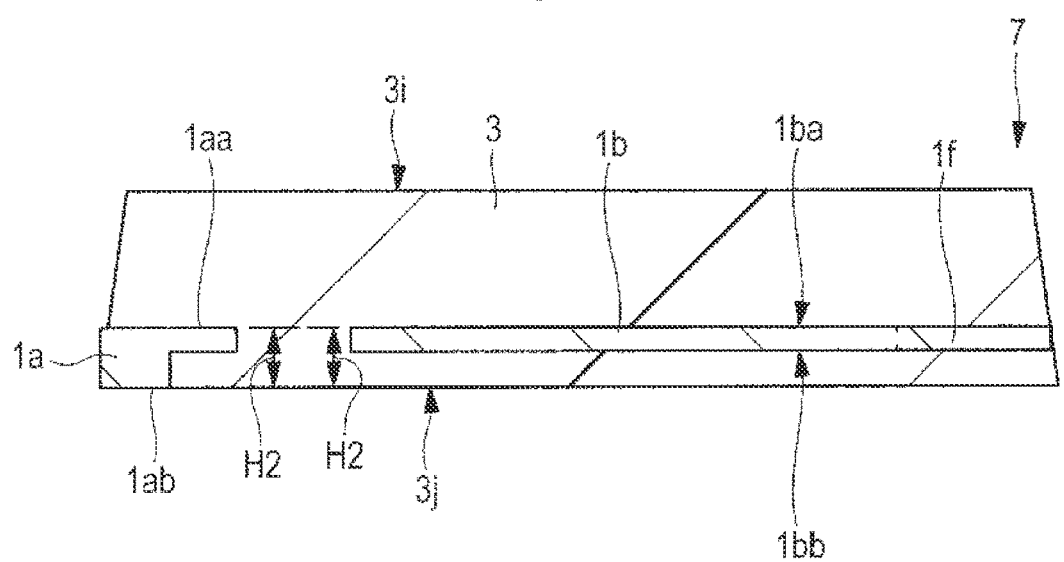
FIG. 12 is a cross-sectional view illustrating a structure cut along a line B-B illustrated in FIG. 10.

FIG. 10 is a plan view illustrating a structure of a semiconductor device through a sealing body according to a modification of the embodiment. FIG. 11 is a cross-sectional view illustrating a structure cut along a line A-A illustrated in FIG. 10. FIG. 12 is a cross-sectional view illustrating a structure cut along a line B-B illustrated in FIG. 10.

The semiconductor device illustrated in FIG. 10 is a QFN (quad flat non-leaded package) 7 in which the plural leads (terminal portions) 1a are arranged on each of four sides of the sealing body 3. In the QFN 7, as illustrated in FIG. 11, the plural leads 1a are arranged in the periphery of the rear surface 3j of the sealing body 3, and portions (outer portions ab) in which those respective leads 1a are exposed to the rear surface 3j of the sealing body 3 configure external connection terminals of the QFN 7.

Also, in the QFN 7, a rear surface side of ends of the respective leads 1a on the die pad 1c side is half-etched, and a thickness of the respective ends is about ½ of the lead portions. Further, the lower surface 1cb side of the die pad 1c is also half-etched, and thinned. The sealing resin comes around the rear surface of the lower surface 1cb as much as the rear surface side is half-etched and thinned.

That is, the QFN 7 is a compact package having a structure in which the die pad 1c is embedded within the sealing body 3.

Like the QFP 5 in the embodiment, in the QFN 7, the antenna (frame body) 1b is disposed within the sealing body 3 as illustrated in FIG. 10, and a loop antenna is formed by the antenna 1b, the first wire 4a, the second wire 4b, and the semiconductor chip 2.

In this example, the structure of the interior of the sealing body 3 in the QFN 7 in the plan view is identical with the structure of the QFP 5 illustrated in FIGS. 7 to 9, and therefore a repetitive description will be omitted.

That is, also in the QFN 7, the same advantages as those in the QFP 5 can be obtained.

Also, as illustrated in FIGS. 11 and 12, in a cross-sectional structure taken along a direction along the thickness direction of the QFN 7, the die pad 1c and the antenna 1b are arranged at the same height H2. That is, the die pad 1c and the antenna 1b are flush with each other in the cross-sectional view taken along the same direction as the thickness direction of the sealing body 3. This is because the antenna 1b, the respective suspension leads that support the antenna 1b as well as the die pad 1c, the respective suspension leads that support the die pad 1c, and all of the leads 1a arranged in the periphery of the sealing body 3 in the QFN 7, are not also subjected to bending work at all.

The invention made by the present inventors has been described above on the basis of the embodiments of the invention. However, the present invention is not limited to the embodiments of the present invention, but can be variously changed without departing from the spirit of the invention.

For example, in the above embodiments and the modifications, in the semiconductor device (QFP 5, QFN 7), the suspension leads (first bar lead 1j, second bar lead 1k) that do not support the antenna 1b are disposed in the corners of the sealing body 3. However, the suspension leads (first bar lead 1j, second bar lead 1k) that do not support the antenna 1b may not always been provided.

What is claimed is:

1. A semiconductor device, comprising:
a die pad having a chip mounting surface;
a semiconductor chip that is mounted on the chip mounting surface, and having a plurality of electrode pads disposed on a main surface thereof;
a plurality of terminal portions that are arranged around the die pad;
an antenna having a front surface, a rear surface, a first end which is one end, a second end which is another end, and a plurality of bends arranged between the first end and the second end;
three suspension leads that support the antenna;
a first conductive member that electrically connects any one of the electrode pads of the semiconductor chip to the first end of the antenna;
a second conductive member that electrically connects any one of the electrode pads of the semiconductor chip to the second end of the antenna;
a plurality of third conductive members that electrically connects any one of the electrode pads of the semiconductor chip to any one of the terminal portions; and
a sealing body that seals the die pad, the semiconductor chip, the antenna, the three suspension leads, and the first, second, and third conductive members,
wherein the antenna is separated from the die pad and is arranged to be completely symmetrical with respect to a virtual diagonal line of a plan view of the sealing body; wherein in the plan view of the sealing body, the antenna is arranged on the virtual diagonal line in a corner portion of the sealing body, and the semiconductor chip is arranged on the virtual diagonal line in another corner portion of the sealing body different from the corner portion in which the antenna is arranged; and
wherein any one of the three suspension leads is arranged on the virtual diagonal line.

2. The semiconductor device according to claim 1,
wherein the sealing body includes a first side, a second side opposite to the first side, a third side intersecting with the first side, and a fourth side opposite to the third side in a plan view;
wherein the virtual diagonal line on which the any one of the three suspension leads arranged is a first virtual diagonal line, and the suspension leads on the first virtual diagonal line extend toward a first corner formed by the first side and the fourth side,
wherein a second corner on the opposite side of the first side from the first corner is formed by the first side and the third side,
wherein a third corner on the opposite side of the third side from the second corner is formed by the second side and the third side, and
wherein a fourth corner on the opposite end of the fourth side from the first corner is formed by the second side and the fourth side.

3. The semiconductor device according to claim 2,
wherein the three suspension leads include a first suspension lead, a second suspension lead, and a third suspension lead,
wherein the any one of the three suspension leads arranged on the first virtual diagonal line is the third suspension lead,
wherein the first suspension lead extends toward the second side, and
wherein the second suspension lead extends toward the third side.

4. The semiconductor device according to claim 3,
wherein the first suspension lead is connected to the terminal portion arranged on the second side, and
wherein the second suspension lead is connected to the terminal portion arranged on the third side.

5. The semiconductor device according to claim 4,
wherein a first bar lead that extends toward the second corner, and a second bar lead that extends toward the fourth corner are located outside of the antenna.

6. The semiconductor device according to claim 5,
wherein the first bar lead is connected to the respective terminal portions arranged on the first side and the third side, and
wherein the second bar lead is connected to the respective terminal portions arranged on the second side and the fourth side.

7. The semiconductor device according to claim 2,
wherein the sealing body includes:
a second virtual diagonal line that intersects with the first virtual diagonal line in a plan view;
a first virtual line that divides the first side and the second side into respective two equal parts in the plan view;
a second virtual line that divides the third side and the fourth side into respective two equal parts in the plan view;
a first region that is surrounded by the first side and the fourth side, and the first virtual line and the second virtual line in the plan view;

a second region that is surrounded by the first side and the third side, and the first virtual line and the second virtual line in the plan view;

a third region that is surrounded by the second side and the third side, and the first virtual line and the second virtual line in the plan view; and a fourth region that is surrounded by the second side, the fourth side, the first virtual line, and the second virtual line in the plan view.

8. The semiconductor device according to claim 7, wherein the first end and the second end of the antenna are arranged in the third region so as to face each other.

9. The semiconductor device according to claim 8, wherein the die pad and the semiconductor chip are arranged in the third region.

10. The semiconductor device according to claim 9, wherein the die pad is supported by a fourth lead extending toward the second side, a fifth lead extending toward the third side, and a sixth lead extending along the first virtual diagonal line toward the third corner.

11. The semiconductor device according to claim 10, wherein a first bar lead having one end extended toward the second corner is disposed in the second region, and wherein a second bar lead having one end extended toward the fourth corner is disposed in the fourth region.

12. The semiconductor device according to claim 11, wherein the antenna, the first conductive member, and the second conductive member form a loop antenna through the semiconductor chip.

13. The semiconductor device according to claim 12, wherein the loop antenna is bilaterally symmetrical with respect to the first virtual diagonal line as a center line in the plan view.

14. The semiconductor device according to claim 13, wherein a distance between the terminal portions arranged on the first side in a direction along the fourth side, and the antenna, a distance between a part of the terminal portions arranged on the second side in a direction along the fourth side, and the antenna, a distance between the terminal portions arranged on the fourth side in a direction along the first side, and the antenna, and a distance between a part of the terminal portions arranged on the third side in a direction along the first side, and the antenna, are equal to one another.

15. The semiconductor device according to claim 14, wherein the terminal portions arranged on the first side, and the terminal portions arranged on the fourth side are dummy electrodes.

16. The semiconductor device according to claim 15, wherein a part of the terminal portions arranged on the second side and a part of the terminal portions arranged on the third side are dummy electrodes.

17. The semiconductor device according to claim 16, wherein the die pad and the antenna are arranged at the same height in a cross-sectional view taken along the same direction as a thickness direction of the sealing body.

18. The semiconductor device according to claim 17, wherein the semiconductor device is one of a quad flat package (QFP) and a quad flat non-leaded package (QFN) in which the terminal portions are arranged on each of the four sides of the sealing body.

19. The semiconductor device according to claim 1, wherein the any one of the three suspension leads that is arranged on the virtual diagonal line also extends in parallel with the virtual diagonal line.

* * * * *